US006125964A

United States Patent [19]

Tsai

[11] Patent Number: 6,125,964

[45] Date of Patent: Oct. 3, 2000

[54] ELECTRIC HORN STRUCTURE WITH THE TRUMPET BODY AND THE RESONATOR IN ONE PIECE

[76] Inventor: Jung-Kuo Tsai, 2F, No.39, Alley 46, Lane 52, Sec., 3, Chin Cheng Rd., Tu Cheng Taipei Hsien, Taiwan

[21] Appl. No.: 09/128,970

[22] Filed: Aug. 4, 1998

[30] Foreign Application Priority Data

Jan. 13, 1998 [TW] Taiwan ................................ 87200543

[51] Int. Cl.[7] ........................................ H05K 5/00

[52] U.S. Cl. ........................................ 181/152

[58] Field of Search ........................ 181/152, 171, 181/172, 141, 150, 179, 195; 116/137 R; 340/391.1

[56] References Cited

U.S. PATENT DOCUMENTS

| | | | |
|---|---|---|---|
| 1,157,292 | 10/1915 | Bretz | 116/137 R |
| 2,722,991 | 11/1955 | Carbonneau | 181/179 |
| 3,855,428 | 12/1974 | Itagaki | 181/171 |
| 4,234,766 | 11/1980 | Cacho | 181/171 |
| 4,664,055 | 5/1987 | Hayashi | 116/137 R |

*Primary Examiner*—Khanh Dang
*Attorney, Agent, or Firm*—Birch, Stewart, Kolasch & Birch, LLP

[57] ABSTRACT

An electric horn structure with the trumpet body and resonator in one piece. The body is seamless and comprises a pipe section as the resonator and trumpet section, wherein the trumpet section further comprises an outward hook-shaped reinforced rim at the larger diameter end of the trumpet section. By providing the seamless one-piece horn structure, the electric horn utilizing the present invention can have stable vibration-and-sound wave conversion, excellent sound quality, extended lifetime, small size and high performance capability.

11 Claims, 3 Drawing Sheets

ELECTRIC HORN STRUCTURE WITH THE TRUMPET BODY AND THE RESONATOR IN ONE PIECE

BACKGROUND OF THE INVENTION

1. Field of the Invention

The invention relates to an electric horn structure having a trumpet body and a resonator, and more particularly to the electric horn structure whose trumpet body and resonator is made in one piece. By providing the one piece electric horn structure, the manufacturing process of the electric horn can be simplified, the cost can be reduced, and the sound quality of the electric horn can be improved.

2. Description of the Prior Art

As well known in the art, an electric horn is a kind of sound conveyor. Referring to FIG. 1, a typical electric horn 1 has a resonator 11 which is circumambiently wrapped by a metal coil 10 and with one end installed onto an extruding central shaft 120 of an electromagnetic base 12. The other end of the resonator 11 is then adhered to a trumpet body 13 which includes an adhered seal plate 14 in the center located close to the end adjacent to the resonator 11. While applying the electrical power to the electric horn structure, the resonator 11 wrapped by the metal coil 10 will be induced and vibrate around the central shaft 120 of the electromagnetic base 12. As the resonator vibrates, sound waves with various frequencies will be generated and propagate outwards through the trumpet body 13. Thus, audible sound is generated by the electric horn 1.

Obviously, the resonator 11 and the trumpet body 13 are two major parts in the electric horn 1 for sound generating. Thus, the manufacturing and the material for these two parts are especially crucial in the quality of the electric horn 1. Referring now to FIG. 2, the manufacturing process of a conventional resonator 11 includes utilizing a metal or non-metal sheet to roll into a hollow cylinder shell 110 with a proper outer diameter, and applying a paper sheet 11 onto the outer surface of the hollow cylinder shell 110 by a layer of glue 112 to stabilize the profile of the hollow cylinder shell 110. On the other hand, the inner diameter of each cross section of the trumpet body 13 tapers to an inner diameter slightly larger than the outer diameter of the resonator 11 at the extended edge 130 of the trumpet body 13, no matter what kind of material (paper or metal) is used for the trumpet body 13 and which the extended edge 130 is thus formed an outside covering connection to the resonator 11. While connecting the trumpet body 13 and the resonator 11, a layer of gum 15 is applied between the extended edge 130 and the resonator 1 for joining the trumpet body 13 and the resonator 11 into a unit. The trumpet rim 131 at the larger diameter end of the trumpet body 13 is adhered by a buffer plate 16. By providing the buffer plate 16, the trumpet body 13 can be adhered to the frame 17 of the electric horn 1.

Due to the consideration of the capacity of the electromagnet base 12 and the vibration need, it is critical to select the material and the thickness for every part of conventional electric horn 1. Because the resonator 11 is driven by the electromagnet base 12, the material for the resonator 11 should be as lightweight as possible. Because the trumpet body 13 is used to transform the vibration of the resonator 11 into sound wave, the material for the trumpet body 13 should be as lightweight as possible, too. Conventionally, lightweight material is used to be rolled into a resonator 11, and to be pressed into a trumpet body 13, separately. Then, the resonator 11 and the trumpet body 13 are glue connected. It would seem that the manufacturing of the resonator 11 and the trumpet body 13 is trivial; the process requiring only rolling and pressing. However, the manufacturing work for these two parts is laborious.

In aforesaid description, the hollow cylinder shell of the resonator 11 can't be firmly set right after the rolling process. A paper sheet is applied onto the outer surface of the resonator 11 so that the seam of the cylinder shell can be protected from dislocation and the cylinder shape of the shell can be maintained. Finally, after all these processes, the resonator 11 then can be adhered to the pressed trumpet body 13. As made evident, the conventional manufacturing process for the horn is laborious, and takes at least two gluing steps. Moreover, the assembly of the resonator 11 and the trumpet body 13 from aforesaid manufacturing process has various disadvantages, such as the following.

1. The resonator is wrapped and secured by the paper sheet to prevent from the deformation at the seam of the cylinder shell. However, such a resolution does not only cost in process time, but also achieves very limited strength to bear the vibration from the resonator. If a vibration with substantial energy is excited, it is quite possible that the paper sheet will fail to protect the seam, eventually, and the resonator will be torn apart from the seam. The damage in the resonator will lead to jamming at the junction of the resonator and the electromagnetic base, and consequently no vibration can be induced at the resonator.
2. The resonator and the trumpet body, binded by glue, will undergo cyclic shearing excitation between the glue interface, while in operation, due to the vibration from the resonator, weights and restraints of the resonator, the trumpet body, and all other related parts. The existence of the cyclic excitation will damage the binding between the resonator and the extended edge of the trumpet body and possibly result in the deviation of the induced sound waves.
3. An extremely small eccentricity between the resonator and the trumpet body is essential for a convention electric horn to perform well. An eccentricity over tolerance will definitely jam the resonator motion with respect to the central shaft of the electromagnetic base. Such a high precision requirement in eccentricity does not only cost difficulty in binding, but can also cause a high failure rate in horn assembly due to the manual binding work.
4. The trumpet body of a conventional electric horn is made of thin metal or non-metal sheet by pressing/stamping. Under the pressing/stamping process, the larger diameter end of the trumpet body will become thinner and less stiff which will lead possibly to a noisy sound wave while the horn is at work. The generation of the noisy sound wave is particularly obvious and intolerable in a horn with metal trumpet body. Moreover, the buffer plate adhered to the trumpet rim cannot provide sufficient support and restraint for the trumpet body connecting with the horn frame, so that the noisy sound wave can't be blocked in a conventional electric horn.

Therefore, an invention devoting to resolving aforesaid disadvantages of conventional electrical horn is necessary.

SUMMARY OF THE INVENTION

Accordingly, it is a primary object of the present invention to provide an electric horn structure with the trumpet body and the resonator in one piece for improving aforesaid disadvantages of the conventional electric horn structure.

According to the present invention, the resonator and the trumpet body are manufactured in one piece to get rid of the covering paper sheet and gluing in manufacturing a conventional electric horn and to prevent problems of short lifetime and resonant instability from a conventional electric horn. Moreover, the electric horn structure with the trumpet body and the resonator in one piece according to the present invention further comprises a reinforced rim extended from the larger diameter edge of the trumpet body. By providing the reinforced rim, undesirable sound waves from the trumpet body can be reduced to a minimum. The connection between the trumpet body and a buffer plate is achieved by firmly hooking the reinforced rim to the hook end of the buffer plate. This type of connection can provide better strength and stiffness than the adhesive method in the prior art. Also, the electric horn structure with the trumpet body and the resonator in one piece provides better performance in manufacturing a high-efficiency horn.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitive of the present invention, and wherein.

DESCRIPTION OF THE PREFERRED EMBODIMENTS

The invention disclosed herein is directed to an electric horn structure having a trumpet body and resonator integrated as one piece. In the following description, numerous details are set forth in order to provide a thorough understanding of the present invention. It will be appreciated by one skilled in the art that variations of these specific details are possible while still achieving the results of the present invention. Furthermore, well-known components are not described in detail in order not to unnecessarily obscure the present invention.

Figure 1:
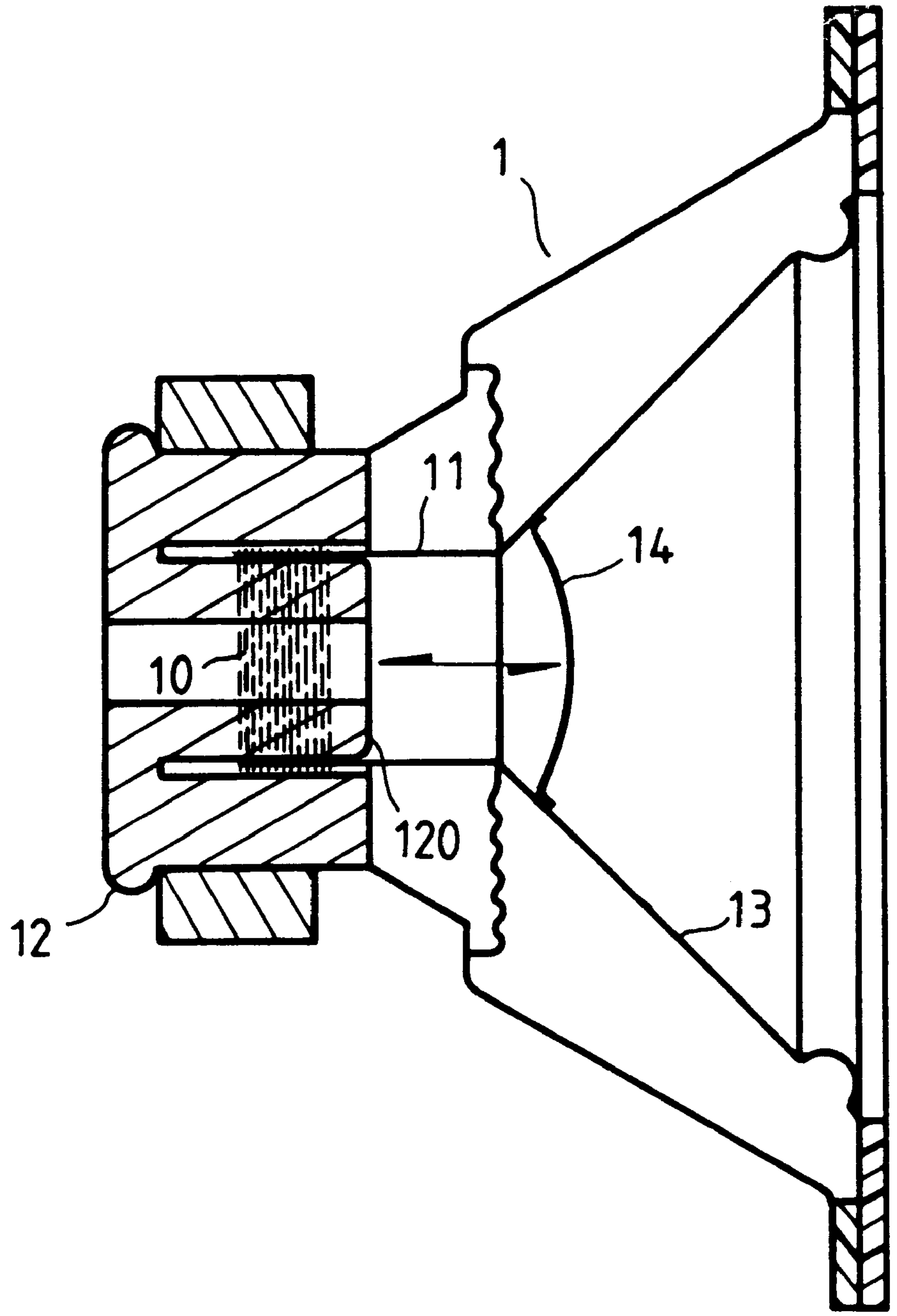
FIG.1 PRIOR ART
FIG. 1 is a sectional view of part of the conventional electric horn structure.
Figure 2:
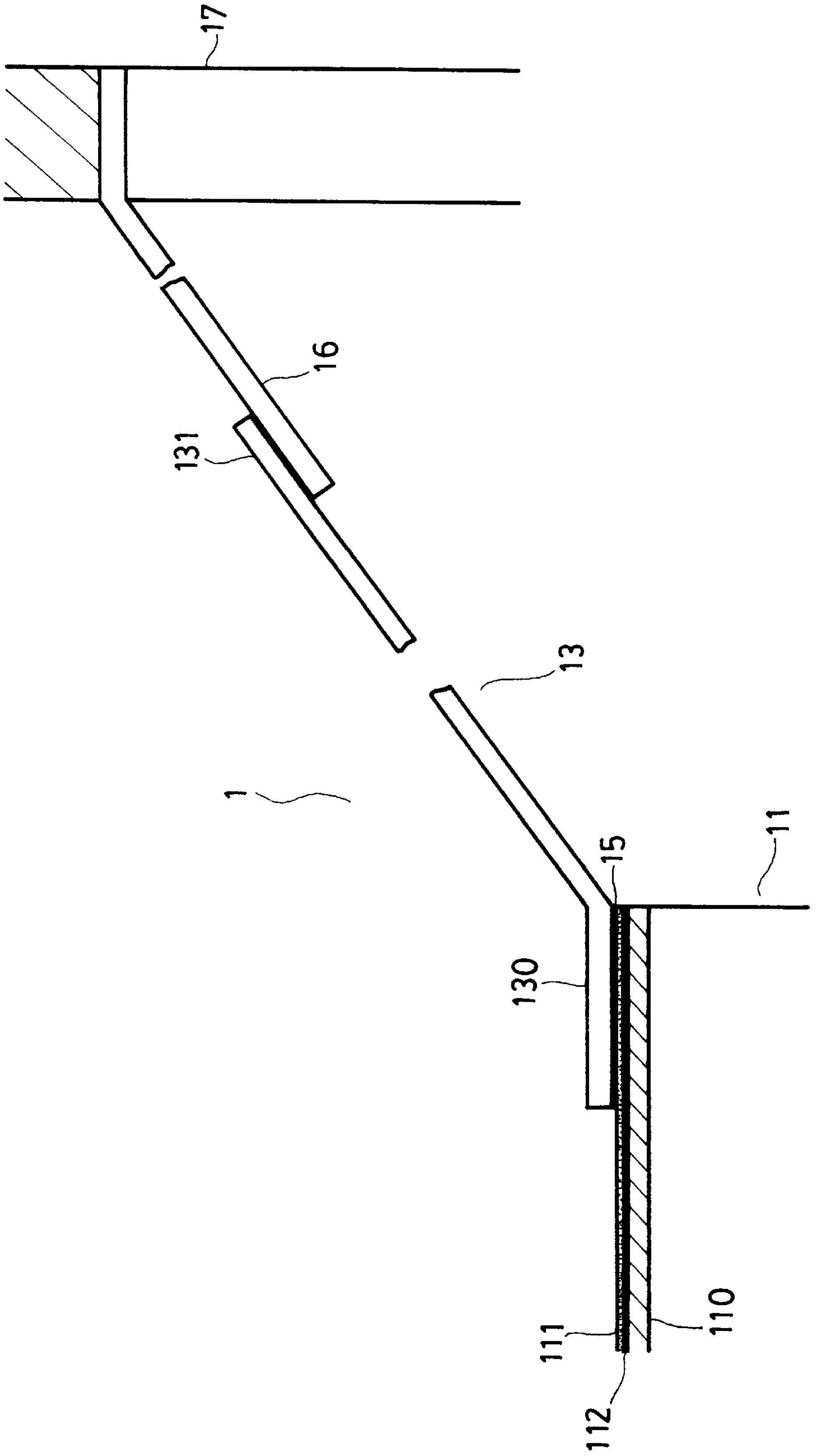
FIG.2 PRIOR ART
FIG. 2 is a sectional view of part of the conventional electric horn structure shown in FIG. 1 to illustrate the connection relationship between the resonator and the trumpet body.
Figure 3:
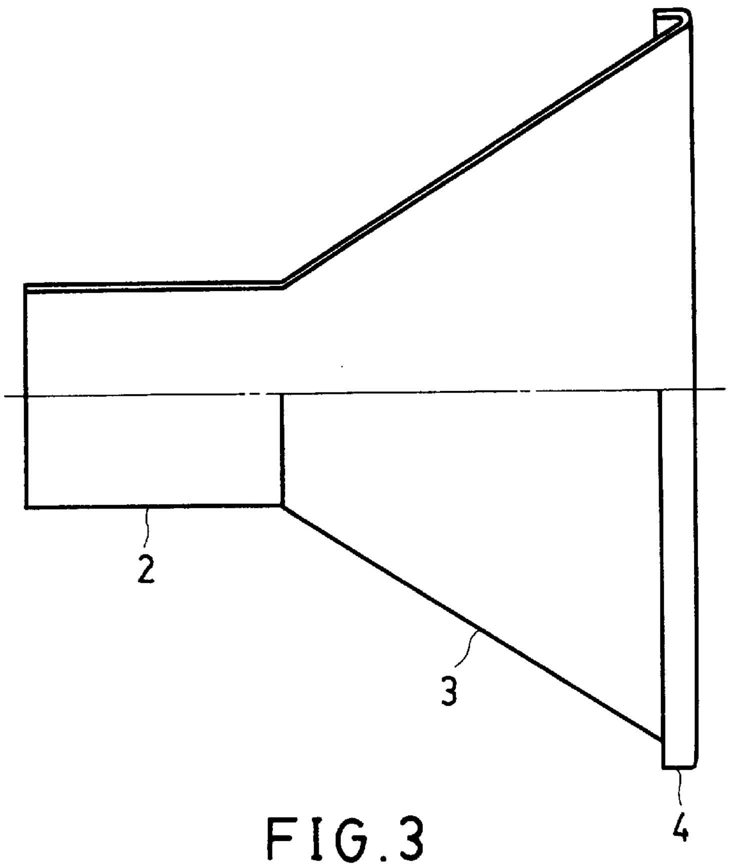
FIG. 3 is a half-sectional front view of the preferred electric horn structure with the trumpet body and the resonator in one piece in accordance with the present invention.

Referring now to FIG. 3, in accordance with the present invention, a half-sectional front view of the preferred electric horn structure with the trumpet body and resonator in one piece is shown. The horn structure according to the present invention is a piece processed by pressing and rolling, and which the piece includes a pipe section 2 and a trumpet section 3. The pipe section 2 is constructed to become the resonator of the horn, and the trumpet section 3 becomes the trumpet body of the horn. At the larger diameter end of the trumpet section 3, a reinforced rim 4 hook-shaped extruding by extending the edge of the trumpet section 3 outward and toward the smaller diameter end of the trumpet section 3.

Figure 4:
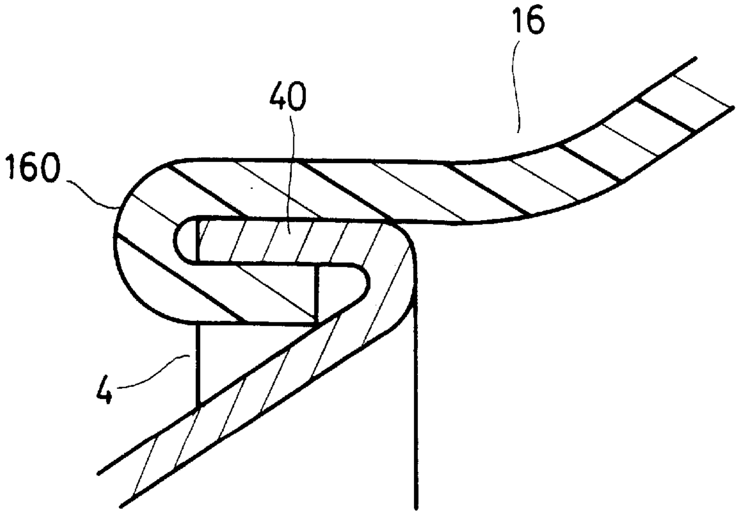
FIG. 4 is a sectional view to illustrate the connection relationship between the reinforced rim and the buffer plate of the preferred electric horn with the trumpet body and the resonator in one piece in accordance with the present invention.

Referring now to FIG. 4, in accordance with the present invention, a sectional view to illustrate the connection relationship between the reinforced rim 4 and the buffer plate 16 of the preferred electric horn with the trumpet body and the resonator in one piece is provided. The installation arrangement of a horn utilizing the present invention is basically the same as that in a conventional horn. The connection of the trumpet section 4 and the horn frame ahs a buffer plate 16 in between. However, to act as a counter part of the trumpet section 4 in accordance with the present invention, one end of the buffer plate 16 is made to a corresponding hook shape 160 while connecting with the hook end 40 of the reinforced rim 4. In addition, the hooking connection of the reinforce rim 4 and the buffer plate 16 can be further secured by applying binding agent between the hook end 40 of the reinforce rim 4 and the corresponding hook shape 160 of the reinforced rim 4. In addition, the hooking connection between the trumpet section 3 and the buffer plate 16 can provide not only a self-lock connection, but a tremendous connection strength in between as well.

By providing the one-piece horn structure and the reinforced rim 4 at the larger diameter end of the trumpet section 3, the horn structure with the trumpet body (i.e., the trumpet section 3) and the resonator (i.e., the pipe section 2) in one piece according to the present invention thus can achieve following advantages:

1. The resonator is formed in a single manufacturing process. A seam is not required; therefore, known problems arising from seams in the prior art are recitified. Furthermore, as a result, no paper sheet for covering the resonator is required. Therefore, the occurrence of a jam between the resonator and the central shaft of the electromagnetic base, caused by a damage seam in the resonator, is no longer possible in the present invention.
2. Producing the resonator and the trumpet body in one piece, eliminates the gluing process required for a conventional horn. Specifically, connecting the resonator and the trumpet body, as in a conventional horn, requires greater manufacturing time and creates problems, if the resonator and trumpet body must be disassembled.
3. The one-piece structure of the resonator and the trumpet body in the present invention precludes the eccentricity problem in a conventional horn, so in the present invention the trumpet body can have a better performance in generating the sound waves.
4. The reinforced rim in the present invention, at the larger diameter end of the trumpet body, improves the structure strength of the electric horn and, thus, can reduce undesirable sound to a minimum.
5. By providing a one-piece horn structure and a reinforced rim at the larger diameter end of the trumpet body, the electric horn structure with the trumpet body and resonator in one piece will have a greater lifetime and better sound frequency control. In particular, the seamless resonator can endure a higher capacity output, which will make possible a horn product with small size but high capacity.

While the present invention has been particularly shown and described with referenced to a preferred embodiment, it will be understood by those skilled in the art that various changes in form and detail may be without departing from the spirit and scope of the present invention.

I claim:

1. An electronic horn structure comprising:

a trumpet body and resonator formed as one continuous, one-piece pipe section, the trumpet body extending from the contiguous body of the resonator at an angle;

a reinforced rim on an end of the trumpet body, the reinforced rim being bent at an angle relative to the trumpet body so that the rim folds back on the trumpet body to form a channel; and a buffer plate being connected with said reinforced rim at the channel.

2. The electric horn structure according to claim 1, wherein said resonator is without a paper sheet covering.

3. The electrical horn structure according to claim 1, wherein the angle at which the trumpet body extends from the contiguous body of the resonator is a generally constant angle.

4. The electrical horn structure according to claim 1, wherein the channel formed by the rim is on an exterior side of the trumpet body.

5. The electrical horn structure according to claim 1, wherein the buffer plate has a channel into which an edge of the rim is inserted and wherein the buffer plate has an edge which is inserted into the channel formed by the rim of the trumpet body.

6. The electrical horn structure according to claim 5, wherein the edge of the buffer plate extends around the periphery of the buffer plate and wherein the edge of the rim extends around the periphery of the rim and wherein the rim and buffer plate are hook-connected.

7. The electrical horn structure according to claim 1, wherein the rim is non-perpendicular to the trumpet body.

8. The electrical horn structure according to claim 1, wherein said reinforced rim is hook-shaped.

9. The electrical horn structure according to claim 8, wherein said buffer plate is connected with said reinforced rim by binding said hook-shaped end of said reinforced rim with a corresponding hook shape at an end of said buffer plate.

10. The electrical horn structure with the trumpet body and the resonator in one piece according to claim 1, wherein said reinforced rim and said buffer plate are hook-connected.

11. The electrical horn structure with the trumpet body and the resonator in one piece according to claim 1, wherein said pipe section is seamless.

* * * * *